United States Patent
Khayat et al.

[11] Patent Number: 5,886,487
[45] Date of Patent: Mar. 23, 1999

[54] DC MOTOR DRIVER HAVING OUTPUT FETS THAT CONDUCT TO RECTIFY OUTPUT OVERVOLTAGE AND UNDERVOLTAGE TRANSIENTS

[75] Inventors: Joseph M. Khayat, Bedford; Jeffrey D. Putsch, Nashua, both of N.H.

[73] Assignee: Unitrode Corporation, Merrimack, N.H.

[21] Appl. No.: 67,890

[22] Filed: Apr. 28, 1998

Related U.S. Application Data

[60] Provisional application No. 60/044,357 Apr. 29, 1997.
[51] Int. Cl.$^6$ .................................................. H02B 7/00
[52] U.S. Cl. ........................................ 318/254; 318/439
[58] Field of Search ............................. 318/254, 439, 318/138; 361/23–31

[56] References Cited

U.S. PATENT DOCUMENTS

| | | | |
|---|---|---|---|
| 4,364,004 | 12/1982 | Bourbeau | 318/721 |
| 4,384,242 | 5/1983 | Ono | 318/721 |
| 4,686,436 | 8/1987 | Archer | 318/254 |
| 4,958,115 | 9/1990 | Miller | 318/662 |
| 5,041,768 | 8/1991 | Herrmann | 318/138 |
| 5,119,000 | 6/1992 | Schultz | 318/254 |
| 5,331,258 | 7/1994 | Lankin et al. | 388/829 |
| 5,397,967 | 3/1995 | Carobolante et al. | 318/254 |
| 5,504,402 | 4/1996 | Menegoli | 318/377 |
| 5,513,058 | 4/1996 | Hollenbeck | 361/36 |
| 5,610,486 | 3/1997 | Li | 318/439 |

*Primary Examiner*—Jonathan Wysocki
*Attorney, Agent, or Firm*—Weingarten, Schurgin, Gagnebin & Hayes LLP

[57] ABSTRACT

A motor-winding driver circuit includes a high-side double-diffused metal-oxide-semiconductor (DMOS) field-effect transistor (FET) connected between a direct-current (DC) power supply node and a driver output node, and a low-side DMOS FET connected between the driver output node and ground. A high-side drive circuit and a low-side drive circuit regulate the driver output voltage to prevent a parasitic bipolar PNP transistor in the high-side FET from conducting, so that latchup is avoided. A parasitic N+/P-substrate diode in the low-side FET is also prevented from conducting. The low-side and high-side driver circuits have additional circuitry causing them to act as active clamp circuits during extreme over- or under-voltage conditions. A body-switching circuit connects the body of the high-side DMOS FET to the driver output node during normal operation, and connects the body to the DC supply node when the driver output voltage exceeds the DC source voltage.

13 Claims, 3 Drawing Sheets

DC MOTOR DRIVER HAVING OUTPUT FETS THAT CONDUCT TO RECTIFY OUTPUT OVERVOLTAGE AND UNDERVOLTAGE TRANSIENTS

CROSS REFERENCE TO RELATED APPLICATIONS

This application claims priority of provisional patent application serial No. 60/044,357, filed Apr. 29, 1997, and entitled, "DC Motor Drivers with Full Synchronous Rectification in a Vanilla CMOS/DMOS Process".

BACKGROUND OF THE INVENTION

The present invention is related to the field of direct-current (DC) motor controller circuits.

Field-effect transistors (FETs) are commonly used as switches in the output stage of DC motor controllers to intermittently provide high current to windings of the motor to control the motor's rotation. In one common configuration two FETs are connected in series between a positive power supply and ground, and the node between the FETs is connected to a winding of the motor. In this configuration the FET connected between the supply and the winding is commonly referred to as the "high-side" FET, and the other as the "low-side" FET. In a multi-phase motor, other pairs of FETs are similarly connected to the other windings of the motor. Separate drive signals are provided to each FET, and the FETs are switched on and off, or commutated, in a predetermined pattern through each revolution of the motor such that the direction and speed of motor rotation are maintained in a desired fashion.

One particular type of FET used in motor drivers is a double-diffused metal-oxide-semiconductor (DMOS) FET. A DMOS FET offers similar performance per area as an N-channel MOS (NMOS) device, yet it is more suitable for high-voltage motor applications. One of the characteristics of DMOS FETs is that in addition to source, gate, and drain terminals, they have a fourth terminal connected to a "body" region of the device. In many applications the body terminal is connected directly to the source terminal. When DMOS FETs are used to drive a motor winding as described above, the low-side DMOS FET in each pair has its drain connected to the winding, and its source and body connected to ground. The high-side DMOS FET has its drain connected to the DC power supply, and its source and body connected to the winding.

When a motor driver FET switches abruptly from the conducting state to the non-conducting state, it is possible for the voltage at the node connected to the winding to momentarily take on a large value with respect to other voltages in the driver circuit. This excessive voltage is commonly referred to as either "overshoot" or "undershoot". "Overshoot" refers to an overvoltage condition in which the driver output voltage is higher than the voltage at the drain of the high-side FET, which is typically the power supply voltage. "Undershoot" refers to an undervoltage condition in which the driver output voltage is lower than the voltage at the source/body of the low-side FET, which is typically ground. Overshoot and undershoot arise from the fast switching of currents in an inductive circuit component such as a motor winding.

Inductive overshoot and undershoot voltages can cause problems for motor driver circuits. An inductive overshoot above the DC supply can turn on a parasitic vertical bipolar positive-negative-positive (PNP) transistor formed by the body and drain of the high-side DMOS FET and the P-type substrate used to fabricate the integrated circuit. The body, drain, and P-type substrate are the emitter, base and collector of the PNP transistor, respectively. If the overshoot voltage is great enough, this parasitic PNP transistor can conduct substantial current, which can lead to two problems. One problem, commonly known as "latch-up", is a condition in an integrated circuit in which a parasitic silicon-controlled rectifier becomes permanently turned on, and it conducts such an extremely high current that the integrated circuit is destroyed. Another problem with current flowing through the parasitic PNP transistor is that current is being diverted away from an intended current path between the body and drain of the FET (i.e., the motor winding and the DC supply), resulting in wasted power. This waste can be especially problematic under power-loss conditions when the motor driver circuitry is being powered by the back electromagnetic force (back EMF) of the motor windings.

An inductive undershoot voltage less than ground can turn on a parasitic PN diode formed by the $P^-$-type substrate and the $N^+$-type drain of the low-side DMOS FET. If this diode becomes forward biased, it injects minority carriers into the substrate, which could potentially lead to latchup problems as previously described.

One general approach to preventing the parasitic PNP transistor or PN diode from conducting is to regulate the driver output voltage so that it is prevented from reaching a value effective to turn the devices on. One common manner of regulating the output voltage is to connect Schottky diodes in parallel with the driver FETs. A Schottky diode becomes forward biased at a lower voltage than a regular PN junction diode. The Schottky diode in parallel with the high-side FET conducts when the output voltage becomes higher than the supply voltage by the voltage drop of a forward-biased Schottky diode. Similarly, the Schottky diode in parallel with the low-side FET conducts when the output voltage becomes lower than ground by the voltage drop of a forward-biased Schottky diode. The conducting of the Schottky diodes prevents the output voltage from reaching a value high or low enough to cause the parasitic devices in either the high-side or low-side FET to conduct.

The use of Schottky diodes increases the number of components used for the motor controller circuitry, and therefore increases the cost of the circuitry and the amount of circuit board space needed by the circuitry. These increases are significant in a motor controller circuit that is contained on a single integrated circuit or chip. The use of off-chip components such as Schottky diodes reduces the benefits associated with integrated circuits, such as reduced cost and reduced space requirements.

Another approach to the problem of excessive overshoot specifically is to manufacture the driver FETs by a process that is designed to minimize the effect of the parasitic PNP transistor. In one such process, a layer of $N^+$ semiconductor is created within the silicon substrate at the site where a DMOS FET is to be created. This "buried" $N^+$ layer creates a barrier to the flow of current between the body of the FET (PNP emitter) and the substrate (PNP collector). As a result, the output voltage need not be regulated to avoid turning on the parasitic PNP transistor. Instead, the buried layer limits the amount of current conducted by the parasitic PNP transistor to a small fraction of the current conducted between the body and drain of the FET.

Unfortunately, an $N^+$ buried layer does not help in the case of an undershoot which turns on the drain-to-substrate parasitic PN diode. Also, the use of buried layers requires a specialized semiconductor manufacturing process that is more complicated and expensive than is otherwise necessary for the manufacture of motor driver circuits. Accordingly, there has been a need for alternative solutions to the problem of excessive overshoot and undershoot on the output of motor driver FETs that allows for the use of relatively simple semiconductor processing techniques and that enables the cost and size advantages of circuit integration to be fully realized.

BRIEF SUMMARY OF THE INVENTION

In accordance with the present invention, a motor driver circuit is disclosed in which parasitic devices such as a parasitic PNP transistor and a parasitic PN diode are prevented from adversely affecting the driver's operation. The circuit regulates the driver output voltage to prevent the parasitic devices from conducting. The circuit does not require the use of buried layers in the silicon substrate on which the FET is formed, nor does it require off-chip regulating components such as Schottky diodes.

The disclosed driver circuit employs a high-side FET and a low-side FET. Additional circuit components are arranged in feedback loops to regulate the driver output voltage to minimum and maximum values that are insufficient to cause the parasitic devices in either FET to conduct. A high-side drive circuit causes the high-side FET to conduct when the output voltage becomes greater than the power supply voltage by more than a small value but is less than an excessively high output voltage sufficient to cause a parasitic PNP transistor within the high-side FET to conduct. Further positive buildup of the output voltage is prevented by the channeling of current from the winding into the power supply. A low-side drive circuit causes the low-side FET to conduct when the output voltage becomes less than ground by more than a small value but is greater than an excessively low output voltage sufficient to forward bias a parasitic PN junction within the low-side FET. Further negative buildup of the output voltage is prevented by the channeling of current from ground into the winding.

The components in the drive circuits are part of the same integrated circuit on which the driver FETs are formed, and thus do not contribute to component count at the circuit board level. Also, because the output voltage is prevented from reaching an excessive value, the parasitic PNP transistor and PN junction are prevented from conducting, so that there is no need for a buried layer or similar circuit feature to reduce the amount of current conducted by parasitic devices. The motor driver circuit can therefore be manufactured according to relatively simple semiconductor processes.

The disclosed driver circuit also employs additional circuitry with the aim of minimizing the effect of overshoot and undershoot on the output. Additionally, other aspects, features, and advantages of the present invention appear in the detailed description which follows.

DETAILED DESCRIPTION OF THE INVENTION

Figure 1:
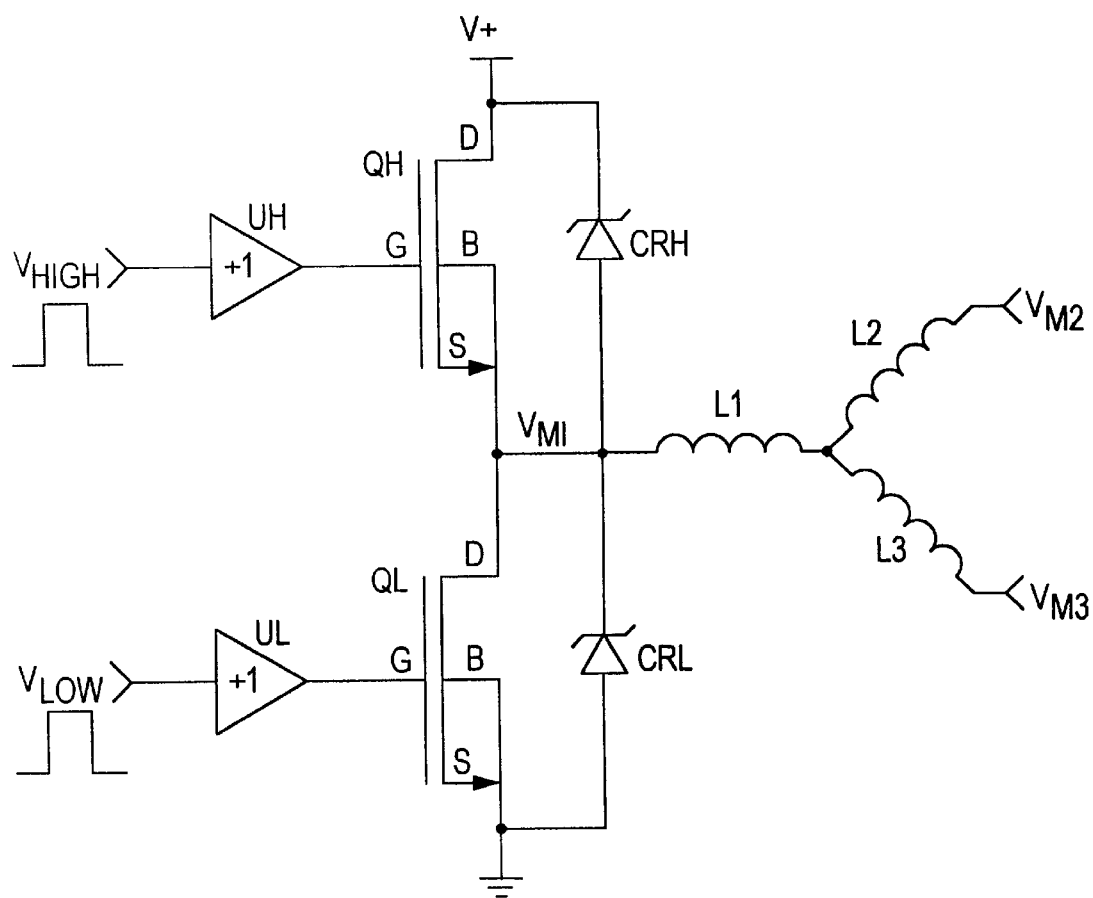
FIG. 1 is schematic diagram of a prior-art motor-winding driver circuit, including Schottky protection diodes.

FIG. 1 illustrates a prior-art motor driver circuit employing a pair of field-effect transistors (FETs) QH and QL. The devices QH and QL are known as double-diffused metal-oxide-semiconductor (DMOS) devices. The body terminal B of each device QH, QL is connected to the source terminal S of the same device as shown.

A high-side drive signal $V_{HIGH}$ is provided to a buffer amplifier UH whose output drives the gate of the high-side FET QH. Similarly, a low-side drive signal $V_{LOW}$ is provided to a buffer amplifier UL whose output drives the gate of the low-side FET QL. The signals $V_{HIGH}$ and $V_{LOW}$ are generated in a known fashion by motor commutation logic, not shown in FIG. 1. A voltage signal $V_{M1}$ appears on the output node of the driver circuit, which is connected to one end of a winding L1 of a motor. For a 3-phase motor, the windings L2 and L3 are driven by signals $V_{M2}$ and $V_{M3}$ generated by similar driver circuits not shown in FIG. 1.

Schottky diodes CRH and CRL are connected in parallel with the FETs QH and QL, respectively. The diodes CRH and CRL limit the voltage swing of the signal $V_{M1}$. When the voltage $V_{M1}$ at the output node overshoots the supply voltage V+, diode CRH acts to prevent the voltage $V_{M1}$ from rising above the supply voltage V+ by more than the forward bias voltage of the diode CRH, which is about 0.2 volts. Similarly, when the voltage $V_{M1}$ undershoots ground, diode CRL acts to prevent the voltage $V_{M1}$ from falling below ground by more than about 0.2 volts.

Figure 2:
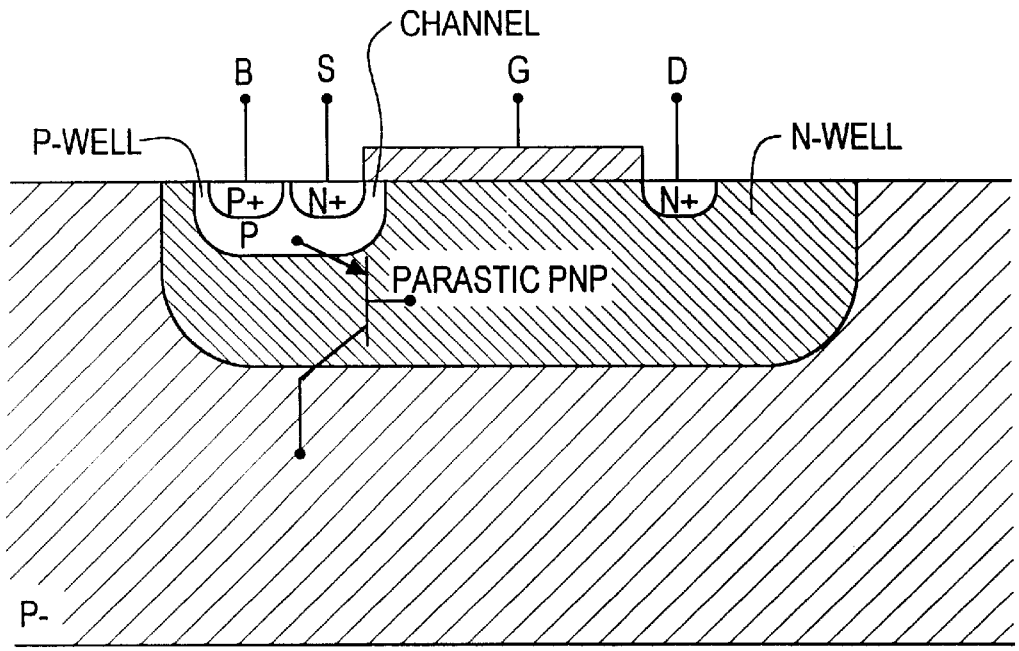
FIG. 2 is a cross-sectional diagram of a prior-art DMOS FET having no buried $N^+$ layer.

FIG. 2 shows the physical structure of a DMOS FET that gives rise to the problems of the prior art as discussed in the Background section above. A parasitic PNP transistor is formed between a P-well forming the body of the DMOS device (PNP emitter), an N-well in which the device is formed (PNP base), and a $P^-$-doped silicon substrate on which the driver circuit is formed (PNP collector). When the voltage between the body B and the drain D becomes sufficiently high, the parasitic PNP transistor conducts current between the body P-well and the $P^-$ substrate, resulting in the latchup problem and the diversion of current away from the power supply, as described in the Background section above.

As can also be seen in FIG. 2, a parasitic PN junction is formed between the substrate and the drain D of the DMOS device. The substrate, which is common to all the devices on an integrated circuit, is normally connected to ground. Thus this parasitic PN junction is forward biased whenever the drain voltage falls below ground by more than about 0.7 volts.

In a driver like that shown in FIG. 1, the body B and the source S in each DMOS FET QH and QL are connected together. Thus in FET QH, the body voltage is equal to the output voltage $V_{M1}$ of the driver, while the drain voltage is equal to the supply voltage V+. In FET QL, the body voltage is equal to ground, while the drain voltage is equal to the output voltage $V_{M1}$. In the absence of the diodes CRH and CRL, the parasitic PNP in FET QH would be turned on when the voltage $V_{M1}$ overshoots the supply voltage by more than the forward-bias voltage of the body-drain PN junction, which is about 0.7 volts. Likewise, the parasitic $N^+/P^-$ diode in FET QL would be turned on when the voltage $V_{M1}$ undershoots ground by more than the same amount.

In the circuit of FIG. 1, the Schottky diodes CRH and CRL prevent the parasitic devices from conducting during either overshoot or undershoot conditions. Diode CRH prevents the voltage $V_{M1}$ from going above V+ by more than 0.2 volts, an amount that is insufficient to forward-bias the body-drain PR junction and therefore insufficient to cause the parasitic PNP transistor in FET QH to conduct. Similarly, diode CRL prevents the voltage $V_{M1}$ from going below ground by more than 0.2 volts, so that the parasitic $N^+/P^-$ diode is prevented from conducting.

Figure 3:
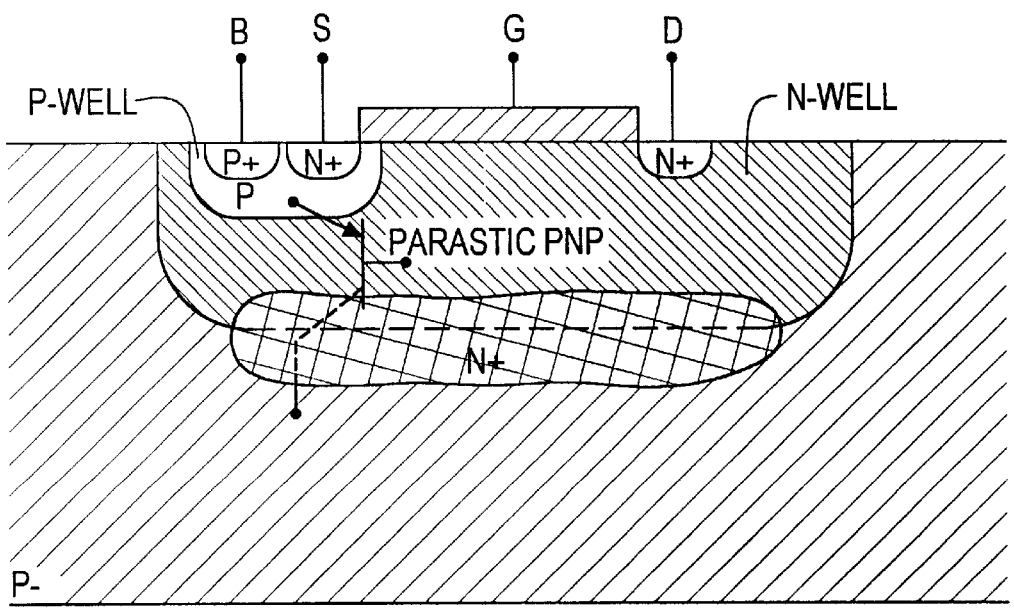
FIG. 3 is a cross-sectional diagram of a prior-art DMOS FET having a buried $N^+$ layer.

FIG. 3 shows an alternative prior art DMOS structure that makes the use of Schottky diode CRH unnecessary in a motor driver circuit. In the alternative structure of FIG. 3, a buried $N^+$ layer is formed at the interface between the N-well and the $P^-$ substrate. The function of the $N^+$ buried layer is twofold. It helps to reduce the vertical PNP emitter-base injection efficiency which in turn reduces the beta value of the vertical PNP. It also helps improve the forward characteristics of the body (P)-drain (N) diode. This diode therefore channels winding current into the DC power supply more effectively, i.e., little current is lost into the substrate. However, as noted in the Background section above, this benefit is attained at the cost of a more complicated and expensive integrated circuit manufacturing process.

Figure 4:
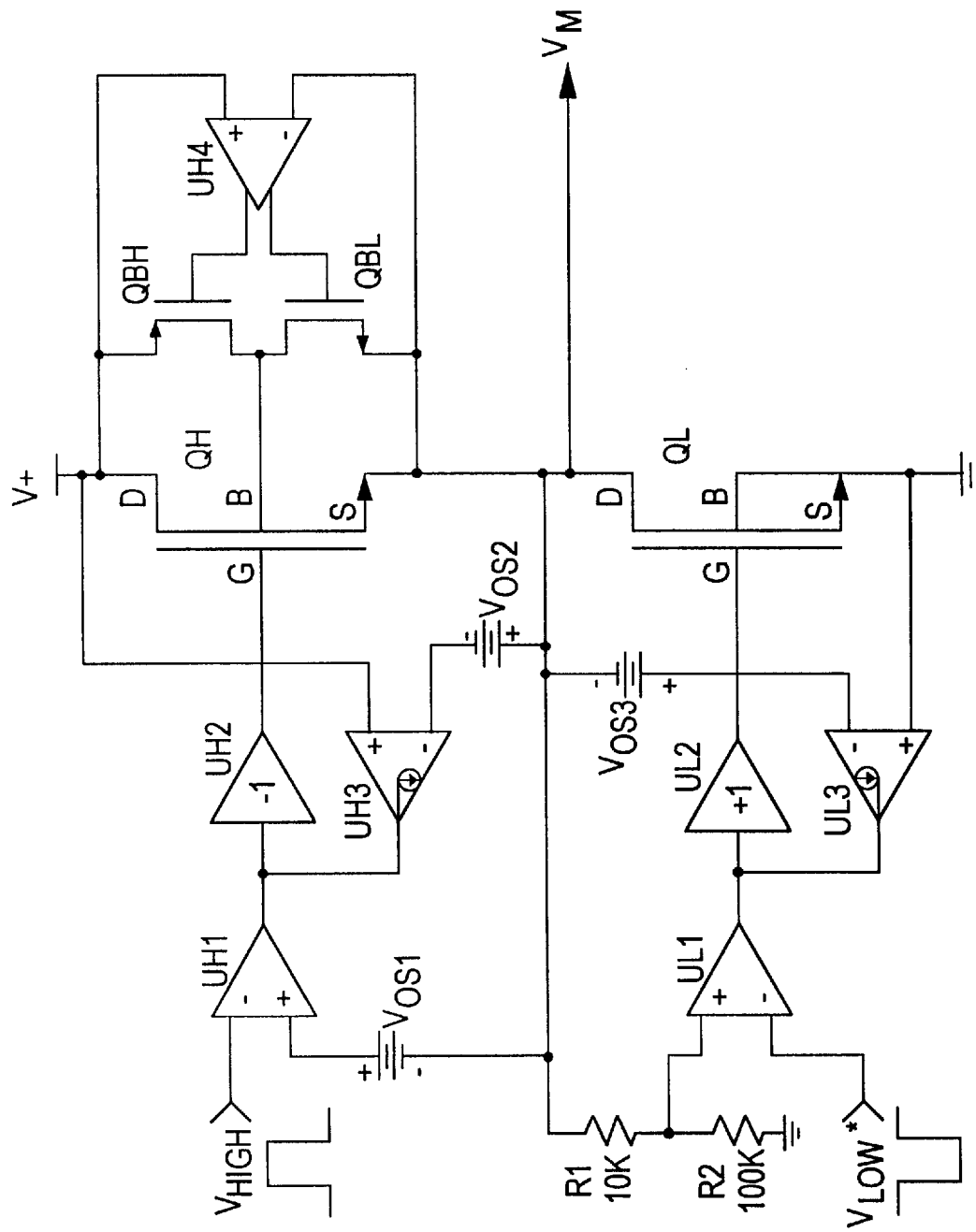
FIG. 4 is a schematic diagram of a driver circuit according to the present invention.

FIG. 4 shows a driver circuit that addresses the problems of overshoot and undershoot in a manner different from the prior art techniques of FIGS. 1 and 3. The circuit includes a high-side drive circuit including devices UH1, UH2 and UH3, a low-side drive circuit including devices UL1, UL2 and UL3, and a body-switching circuit including devices QBH, QBL and UH4. Devices UH2 and UL2 are inverting and non-inverting buffer amplifiers, respectively. Devices UH1, UH3, UL1, and UL3 are differential amplifiers. Amplifiers UH1 and UL1 have output stages with pullup devices and pulldown devices. Amplifier UH3 has an open-drain NMOS output, so that it can pull its output node low but not high. Amplifier UL3 has an open-drain PMOS output, so that it can pull its output node high but not low.

The circuit of FIG. 4 also employs offset voltages in several places, these being represented by the battery voltages $V_{OS1}$, $V_{OS2}$ and $V_{OS3}$. These offset voltages are created by the intentional unbalancing of the input stage of the corresponding differential amplifier. The value of voltage $V_{OS1}$ is preferably about 0.7 volts, or approximately the same as a PN junction forward bias voltage. Voltages $V_{OS2}$ and $V_{OS3}$ are each about 0.2 volts, a value substantially less than a PN junction forward bias voltage but large enough to overcome normal offsets that might otherwise be present at the inputs of the amplifiers UH3 and UL3.

The feedback amplifiers UH3 and UL3 cause FETs QH and QL to conduct during overshoot and undershoot conditions, so that the excursion of the output voltage $V_M$ is limited. When the output voltage $V_M$ overshoots the supply voltage V+ by more than $V_{OS2}$, the loop formed by devices UH3, UH2, QH and the pullup of UH1 regulates the output voltage $V_M$ to the supply voltage V+ plus 0.2 volts. Note that in this case, the logic input $V_{HIGH}$ is set to drive the negative input of amplifier UH1 to a low (zero volts), which in a non-overshoot condition causes the output of buffer amplifier UH2 to be low and QH to be off. During an overshoot, however, the UH3 pulldown regulates the input to UH2 such that UH2 turns on transistor QH to conduct current from source to drain. Thus winding current is conducted from the coil L1 into the supply V+, and the output voltage $V_M$ is regulated to the desired value of V+ plus 0.2 volts.

When the output voltage $V_M$ undershoots ground by more than $V_{OS3}$, the loop formed by devices UL3, UL2, QL and the pulldown of UL1 regulates the output voltage $V_M$ to ground minus 0.2 volts. Note that in this case, the logic input $V_{LOW}^*$ is set to drive the negative input of amplifier UL1 to a high (a predetermined non-zero voltage), which in a non-undershoot condition causes the output of buffer amplifier UL2 to be low and QL to be off. During an undershoot, however, the UL3 pullup regulates the input to UL2 such that UL2 turns on transistor QL to conduct current from source to drain. Thus current is conducted from ground into the coil L1, and the output voltage $V_M$ is regulated to the desired value of ground minus 0.2 volts.

The circuit of FIG. 4 contains other components that carry out two additional functions. Devices UH4, QBH and QBL act to switch the body of the FET QH between the output node $V_M$ and the supply node V+. This switching is desirable in order to prevent the body-source PN junction and the body-drain PN junction (see FIG. 2) from becoming forward biased. Under normal operating conditions in which the voltage $V_M$ is less than V+, the outputs of comparator UH4 are high. This causes FET QBL to conduct and FET QBH to be off, thus effectively connecting the body of FET QH to the output $V_M$. In this condition the voltage of the body-source PN junction is zero volts, and the body-drain PN junction is reverse biased. When the voltage $V_M$ is greater than V+, which occurs during overshoot and also when DC power is lost, the outputs of the comparator UH4 are low. This causes FET QBH to conduct and FET QBL to be off, thus effectively connecting the body of FET QH to the supply node V+. In this case the body-source PN junction is reverse biased, and the voltage of the body-drain PN junction is zero volts.

There are two separate connections shown from the output of comparator UH4 to the respective transistors QBH and QBL. These separate connections enable "break before make" switching, that is, turning off the conducting transistor (QBH or QBL) before turning on the non-conducting transistor (QBL or QBH). This operation ensures that V+ is never shorted to $V_M$ through FETs QBH and QBL, as might happen if FETs QBH and QBL were allowed to conduct simultaneously It is not necessary in the circuit of FIG. 4 for the body of the low-side FET QL to be switched in the manner described above for the high-side FET QH. The source and body of the low-side FET QL are connected to ground, which is the same potential as the $P^-$ circuit substrate. The collector-emitter voltage of the parasitic PNP is therefore held close to zero volts, so the parasitic PNP conducts little if any current.

The second additional function in the circuit of FIG. 4 is carried out by resistors R1 and R2 in conjunction with amplifiers UH1 and UL1. Theme components form clamp circuits that become operative when excessive levels of overshoot or undershoot occur. When the signal $V_{LOW}^*$ transitions from low to high, device QL is turned off abruptly, causing a flyback voltage to appear on $V_M$. If the flyback voltage is great enough, device QH will be turned on by the UH3-UH2-QH loop as discussed above. This loop has an inherent delay, however, during which the flyback voltage could possibly reach breakdown levels of the driver circuit (i.e., levels at which circuit devices are destroyed apart from the action of any parasitic). The negative feedback circuit consisting of R1, R2, and UL1 regulates the voltage $V_M$ in this mode to the quantity $(1+R1/R2)(V_{LOW}^*)$. Essentially, the device QL is prevented from turning fully off until $V_M$ is rectified by the UH3-UH2-QH loop. R1, R2, and the high level of $V_{LOW}^*$ are chosen such that the voltage $V_M$ is maintained below breakdown levels.

Negative feedback provided by device UH1 and offset $V_{OS1}$ has a similar clamping action during excessive undershoot. When $V_M$ undershoots ground by more than about 0.7 volts (the value of $V_{OS1}$) device UH1 causes FET QH to turn back on until the regulation action of the UL3-UL2-QL loop kicks in.

An improved motor driver circuit has been described. It will be apparent to those skilled in the art that modifications to and variations of the above-described driver circuit are possible without departing from the inventive concepts disclosed herein. Accordingly, the invention should be viewed as limited solely by the scope and spirit of the appended claims.

We claim:

1. A circuit for driving a winding of a motor, comprising:
   a high-side field-effect transistor (FET) having a drain, a gate, and a source, the drain being connected to a direct-current (DC) supply node, the source being connected to a driver output node to which the motor winding is to be connected;
   a high-side drive circuit connected to the gate of the high-side FET and being operative to cause the high-side FET to conduct current in response to either (i) the assertion of a high-side drive signal originating external to the motor-winding driving circuit, or (ii) an overvoltage condition in which the voltage at the driver output node is greater than the voltage at the DC supply node and less than an excessively high output voltage sufficient to cause a parasitic PNP transistor within the high-side FET to conduct;
   a low-side FET having a drain, a gate, and a source, the drain being connected to the driver output node, and the source being connected to a ground node; and
   a low-side drive circuit connected to the gate of the low-side FET and being operative to cause the low-side FET to conduct current in response to either (i) the assertion of a low-side drive signal originating external to the motor-winding driving circuit; or (ii) an undervoltage condition in which the voltage at the driver output node is less than the voltage at the ground node and greater than an excessively low output voltage sufficient to forward bias a parasitic PN junction within the low-side FET.

2. A motor-winding driving circuit according to claim 1, wherein the high-side drive circuit includes a high-side amplifier having an output, an inverting input, and a non-inverting input, the output being coupled to the gate of the high-side FET to enable the high-side amplifier to cause the high-side FET to conduct, the inverting input being coupled to the driver output node, and the non-inverting input being coupled to the DC supply node, and wherein the low-side drive circuit includes a low-side amplifier having an output, an inverting input, and a non-inverting input, the output being coupled to the gate of the low-side FET to enable the low-side amplifier to cause the low-side FET to conduct, the inverting input being coupled to the driver output node, and the non-inverting input being coupled to the ground node.

3. A motor-winding driving circuit according to claim 2, wherein the output of the high-side amplifier is an NMOS open-drain output, and the output of the low-side amplifier is a PMOS open-drain output.

4. A motor-winding driving circuit according to claim 2, wherein:
   the input stage of the high-side amplifier is unbalanced such that the high-side amplifier is able to detect and regulate the overvoltage condition despite the presence of offset errors in the input stage of the high-side amplifier; and
   the input stage of the low-side amplifier is unbalanced such that the low-side amplifier is able to detect and regulate the undervoltage condition despite the presence of offset errors in the input stage of the low-side amplifier.

5. A motor-winding driving circuit according to claim 1, further comprising:
   a high-side threshold circuit operative to establish a first threshold amount by which the driver output voltage must be greater than the DC source voltage to cause the high-side FET to conduct current in response to the overvoltage condition; and
   a low-side threshold circuit operative to establish a second threshold amount by which the driver output voltage must be less than ground to cause the low-side FET to conduct current in response to the undervoltage condition.

6. A motor-winding driving circuit according to claim 5, wherein the high-side threshold circuit is a high-side differential amplifier having an input stage being unbalanced by the first threshold amount, and the low-side threshold circuit is a low-side differential amplifier having an input stage being unbalanced by the second threshold amount.

7. A motor-winding driving circuit according to claim 1, wherein the high-side FET is a double-diffused metal-oxide-semiconductor (DMOS) FET having a body, and further comprising a body-switching circuit operative to connect the body to the driver output node during normal operating conditions and to connect the body to the DC supply node during the overvoltage condition.

8. A motor-winding driving circuit according to claim 7, wherein the body-switching circuit comprises:
   a first body-switching FET having a drain, a gate, and a source, the drain being connected to the body of the high-side DMOS FET, the source being connected to the DC supply node;
   a second body-switching FET having a drain, a gate, and a source, the drain being connected to the body of the high-side DMOS FET, the source being connected to the driver output node; and
   a body-switching comparator having two outputs, an inverting input, and a non-inverting input, the outputs being connected to the gates of the first and second body-switching FETs respectively, the inverting input being connected to the driver output node, and the non-inverting input being connected to the DC supply node, the body-switching comparator being operative to generate the two outputs thereof such that the two body-switching FETs are prevented from simultaneously conducting.

9. A motor-winding driving circuit according to claim 1, wherein the low-side FET is a double-diffused metal-oxide-semiconductor (DMOS) FET having a body, the body being connected to ground.

10. A motor-winding driving circuit according to claim 1, wherein:
   the overvoltage condition is a first overvoltage condition and the undervoltage condition is a first undervoltage condition;
   the high-side driver circuit is operative to cause the high-side FET to conduct during a second undervoltage condition in which the driver output voltage is less than the voltage of the ground node by the forward-bias voltage of a positive-negative (PN) junction in the low-side FET; and
   the low-side driver circuit is operative to cause the low-side FET to conduct during a second overvoltage condition in which the driver output voltage is greater than the voltage of the DC supply node by a voltage approaching the breakdown voltage of the motor-winding driving circuit.

11. A motor-winding driving circuit according to claim 10, wherein the high-side driver circuit includes a high-side amplifier having an output, an inverting input, and a non-inverting input, the output being coupled to the gate of the high-side FET to enable the high-side amplifier to cause the high-side FET to conduct, the inverting input being connected to receive an active-high high-side drive signal the assertion of which indicates that the high-side FET is to conduct current between the DC supply node and the motor winding, and the non-inverting input being coupled to the driver output node to detect the second undervoltage condition, and wherein the low-side driver circuit includes a low-side amplifier having an output, an inverting input, and a non-inverting input, the output being coupled to the gate of the low-side FET to enable the low-side amplifier to cause the low-side FET to conduct, the inverting input being connected to receive an active-low low-side drive signal the assertion of which indicates that the low-side FET is to conduct current between the motor winding and a ground node, and the non-inverting input being coupled to the driver output node to detect the second overvoltage condition.

12. A motor-winding driving circuit according to claim 11, wherein the input stage of the high-side amplifier is unbalanced such that the high-side amplifier is able to detect and regulate the second undervoltage condition, and further comprising a resistor network connected between the driver output node and the non-inverting input of the low-side amplifier such that the low-side amplifier is able to detect and regulate the second overvoltage condition.

13. A circuit for driving a winding of a motor, comprising:

a high-side double-diffused metal-oxide-semiconductor (DMOS) field-effect transistor (FET) having a drain, a gate, a body, and a source, the drain being connected to a direct-current (DC) supply node, and the source being connected to a driver output node to which the motor winding is to be connected;

a high-side inverting buffer having an output and an input, the output being connected to the gate of the high-side DMOS FET;

a first high-side amplifier having an output, an inverting input, and a non-inverting input, the output being connected to the input of the high-side inverting buffer, the non-inverting input being connected to the driver output node, and the inverting input being connected to receive an active-high high-side drive signal the assertion of which indicates that the high-side FET is to conduct current between the DC supply node and the motor winding;

a second high-side amplifier having an open-drain output, an inverting input, and a non-inverting input, the output being connected to the input of the high-side inverting buffer, the inverting input being coupled to the driver output node, and the non-inverting input being coupled to the DC supply node;

a first body-switching FET having a drain, a gate, and a source, the drain being connected to the body of the high-side DMOS FET, the source being connected to the DC supply node;

a second body-switching FET having a drain, a gate, and a source, the drain being connected to the body of the high-side DMOS FET, the source being connected to the driver output node;

a body-switching comparator having two outputs, an inverting input, and a non-inverting input, the outputs being connected to the gates of the first and second body-switching FETs respectively, the inverting input being connected to the driver output node, and the non-inverting input being connected to the DC supply node;

a low-side DMOS FET having a drain, a gate, a body and a source, the drain being connected to the driver output node, the body being connected to the source, and the body and source being connected to a ground node;

a low-side non-inverting buffer having an input and an output, the output being connected to the gate of the low-side FET;

a first low-side amplifier having an output, an inverting input, and a non-inverting input, the output being connected to the input of the low-side buffer, the non-inverting input being coupled to the driver output node, and the inverting input being connected to receive an active-low low-side drive signal the assertion of which indicates that the low-side FET is to conduct current between the motor winding and the ground node; and a second low-side amplifier having an open-drain output, an inverting input, and a non-inverting input, the output being connected to the input of the low-side buffer, the inverting input being coupled to the driver output node, and the non-inverting input being connected to the ground node.

* * * * *